United States Patent
Veirman et al.

(10) Patent No.: US 12,224,363 B2
(45) Date of Patent: Feb. 11, 2025

(54) METHOD FOR TREATING A STACK OBTAINED DURING THE MANUFACTURE OF A HETEROJUNCTION PHOTOVOLTAIC CELL

(71) Applicant: COMMISSARIAT À L'ÉNERGIE ATOMIQUE ET AUX ÉNERGIES ALTERNATIVES, Paris (FR)

(72) Inventors: Jordi Veirman, Grenoble (FR); Julie Stendera, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 421 days.

(21) Appl. No.: 17/629,648

(22) PCT Filed: Jul. 24, 2020

(86) PCT No.: PCT/EP2020/070914
§ 371 (c)(1),
(2) Date: Jan. 24, 2022

(87) PCT Pub. No.: WO2021/018757
PCT Pub. Date: Feb. 4, 2021

(65) Prior Publication Data
US 2022/0246774 A1    Aug. 4, 2022

(30) Foreign Application Priority Data
Jul. 26, 2019   (FR) ...................................... 1908538

(51) Int. Cl.
*H01L 31/0376*   (2006.01)
*H01L 31/0747*   (2012.01)
*H01L 31/20*   (2006.01)

(52) U.S. Cl.
CPC .... *H01L 31/03767* (2013.01); *H01L 31/0747* (2013.01); *H01L 31/208* (2013.01)

(58) Field of Classification Search
CPC ........... H01L 31/03767; H01L 31/0747; H01L 31/208
See application file for complete search history.

(56) References Cited

U.S. PATENT DOCUMENTS

2021/0376183 A1* 12/2021 Hallam ............... H01L 31/1864

FOREIGN PATENT DOCUMENTS

| WO | WO 2013/001440 A1 | 1/2013 |
| WO | WO 2013/173867 A1 | 11/2013 |
| WO | WO 2020/082131 A1 | 4/2020 |

OTHER PUBLICATIONS

International Search Report as issued in International Patent Application No. PCT/EP2020/070914, dated Oct. 9, 2020.

(Continued)

*Primary Examiner* — Joseph C. Nicely
(74) *Attorney, Agent, or Firm* — Pillsbury Winthrop Shaw Pittman LLP

(57) ABSTRACT

A method for treating a stack includes a substrate of n-doped crystalline silicon and a passivation layer of hydrogenated amorphous silicon disposed on a face of the substrate, the method including exposing the stack to electromagnetic radiation during a treatment period (t) less than or equal to 12 s, the electromagnetic radiation having an irradiance (E) greater than or equal to 200 kW/m².

19 Claims, 3 Drawing Sheets

(56) References Cited

OTHER PUBLICATIONS

Sun, C., et al., "Complete regeneration of BO-related defects in n-type upgraded Metallurgical-grade Czochralski-grown silicon heterojunction solar cells," Applied Physics Letters, vol. 113, No. 15, Oct. 2018, 5 pages.

Hallam, B. J., et al., "Implications of Accelerated Recombination-Active Defect Complex Formation for Mitigating Carrier-Induced Degradation in Silicon," IEEE Journal of Photovoltaics, vol. 6, No. 1, Jan. 2016, pp. 92-99.

Kobayashi, E., et al., "Increasing the efficiency of silicon heterojunction solar cells and modules by light soaking," Solar Energy Materials and Solar Cells, Jun. 2017, pp. 1-7.

Kobayashi, E., et al., "Light-induced performance increase of silicon heterojunction solar cells," Applied Physics Letters, vol. 109, (2016), 6 pages.

* cited by examiner

METHOD FOR TREATING A STACK OBTAINED DURING THE MANUFACTURE OF A HETEROJUNCTION PHOTOVOLTAIC CELL

CROSS-REFERENCE TO RELATED APPLICATIONS

This application is the U.S. National Stage of PCT/EP2020/070914, filed Jul. 24, 2020, which in turn claims priority to French patent application number 1908538 filed Jul. 26, 2019. The content of these applications are incorporated herein by reference in their entirety.

TECHNICAL FIELD

The present invention relates to a method for treating a stack obtained during the manufacture of a heterojunction photovoltaic cell, so as to improve and stabilise the efficiency of the photovoltaic cell. The invention also relates to a method for manufacturing heterojunction photovoltaic cells.

PRIOR ART

A heterojunction photovoltaic cell is a device capable of absorbing solar radiation and converting it into electrical energy. Such a device comprises a p-n junction formed by the superposition of two semiconductor materials having different bandgap widths, such as crystalline silicon and amorphous silicon.

FIG. 1 shows an example of a silicon heterojunction photovoltaic cell 10 (SHJ). The photovoltaic cell 10 comprises a substrate 11 of doped crystalline silicon and two amorphous silicon layers 12-13 disposed on either side of the substrate 11. One of the amorphous silicon layers 12-13 is doped with the same conductivity type as the substrate 11, for example of the n type, and the other layer is doped with the opposite conductivity type, i.e. the p type.

The heterojunction is formed by the substrate 11 of n-doped crystalline silicon and the p-doped amorphous silicon layer, this layer forming the emitter of the photovoltaic cell. The emitter can be located on the front face or on the rear face of the photovoltaic cell.

The photovoltaic cell SHJ is particularly sensitive to the defects located at the interface between the substrate 11 of crystalline silicon and the amorphous silicon layers 12-13. These defects can be dangling bonds, or impurities such as metal ions. They introduce energy levels in the bandgap of the silicon and increase the number of electron-hole recombinations at the interfaces, which deteriorates the output parameters of the photovoltaic cell, such as the open-circuit voltage $V_{OC}$.

In order to obtain an effective photovoltaic cell, it is therefore necessary to minimise the number of recombinations on the surface of the substrate 11, which is generally accompli by depositing a passivation layer 14 of intrinsic hydrogenated amorphous silicon on each one of the faces of the substrate 11, before the amorphous silicon layer 12, 13. The hydrogen atoms contained in the passivation layers 14 diffuse to the surface of the substrate 11 and neutralise the defects.

Each one of the amorphous silicon layers 12-13 is moreover covered with a transparent conductive oxide (or TCO) layer 15.

SHJ photovoltaic cells are known to have their energy conversion efficiency improve by about 0.3% absolute under the combined action of the lighting and the temperature. This "enhancement" phenomenon of the cells is the result in the improvement of at least one of the passivation layers 14 of hydrogenated amorphous silicon, as well as the improvement in the interfaces between the amorphous silicon layers 12-13 and the TCO layers 15.

Document WO2013/001440 describes an example of a method for treating SHJ photovoltaic cells comprising a substrate of n-doped crystalline silicon. In this treating method, the photovoltaic cell is subjected to a luminous flux of irradiance greater than or equal to 500 W/m² for a period of about 10 hours, while still being heated to a temperature comprised between 20° C. and 200° C. Such a treatment period is incompatible with the throughput of the current photovoltaic cell production lines.

Moreover, the document ["Complete regeneration of BO-related defects in n-type upgraded metallurgical-grade Czochralski-grown silicon heterojunction solar cells", C. Sun et al., Appl. Phys. Lett. 113, 152105, 2018] describes a method for regenerating heterojunction photovoltaic cells made from substrates of metallurgical-grade silicon (or UMG, for "upgraded metallurgical-grade"). This type of material contains large quantities of boron and oxygen atoms that are at the origin of the formation of defects and of a degradation of the open-circuit voltage $V_{OC}$ during the first hours of operation of photovoltaic cells. The document shows that the photovoltaic cells return to their initial open-circuit voltage $V_{OC}$ after 30 to 100 seconds of exposure to a laser that has an irradiance equal to 57 kW/m². The phenomenon observed in this document, specific to n-type silicon photovoltaic silicon compensated with boron, is however different from the sought enhancement phenomenon of the photovoltaic cells, because it is preceded by a phase of degrading the open-circuit voltage $V_{OC}$.

SUMMARY OF THE INVENTION

There is therefore a need to provide a method of treating that can be accomplished at a high throughput during the manufacture of photovoltaic cells, in such a way as to be compatible with requirements of industrial production.

According to a first aspect of the invention, this need tends to be satisfied by providing a method for treating a stack comprising a substrate of n-type crystalline silicon and a passivation layer of hydrogenated amorphous silicon disposed on a face of the substrate, said method comprising a step of exposing the stack to electromagnetic radiation during a treatment period less than or equal to 12 s, the electromagnetic radiation having an irradiance greater than or equal to 200 kW/m².

An irradiance greater than or equal to 200 kW/m² combined with a treatment period less than or equal to 12 s makes it possible to obtain an improvement in the conversion efficiency of the photovoltaic cell while still remaining compatible with the requirements of industrial production. Such an irradiance furthermore makes it possible to be free of means for heating used in the method of the prior art, such as a heating plate.

The treating method according to the first aspect of the invention can also have one or more of the characteristics hereinbelow, taken individually or according to any technically permissible combination.

In an embodiment, the irradiance of the electromagnetic radiation is greater than or equal to 300 kW/m² and the treatment period is less than or equal to 8 s.

In an embodiment, the irradiance of the electromagnetic radiation is greater than or equal to 1000 kW/m² and the treatment period is less than or equal to 2.5 s.

Preferably, the treatment period is inversely proportional to the irradiance of the electromagnetic radiation.

In an embodiment, the electromagnetic radiation is monochromatic and has a wavelength comprised between 400 nm and 1100 nm, preferably between 800 nm and 1000 nm.

According to a development of this embodiment, the treatment period satisfies the following relationship:

$$t \geq 0.23 \times \frac{1000}{E} \times \frac{980}{\lambda}$$

where $\lambda$ is the wavelength of the electromagnetic radiation and E is the irradiance of the electromagnetic radiation.

Preferably, the treatment period furthermore satisfies the following relationship:

$$t \leq \frac{1000}{E} \times \frac{980}{\lambda}$$

In an alternative embodiment, the electromagnetic radiation comprises several components with a wavelength comprised between 400 nm and 1100 nm, preferably between 800 nm and 1000 nm.

According to a development of this alternative embodiment, the treatment period satisfies the following relationship:

$$t \geq 0.23 \times \frac{1}{\sum_{i=1}^{n} \frac{E_i}{1000} \times \frac{\lambda_i}{980}}$$

where i is an index that varies between 1 and the number n of components of the electromagnetic radiation, $\lambda_i$ is the wavelength of the component of index i and $E_i$ is the irradiance of the component of index i.

Preferably, the treatment period furthermore satisfies the following relationship:

$$t \leq \frac{1}{\sum_{i=1}^{n} \frac{E_i}{1000} \times \frac{\lambda_i}{980}}$$

The stack is advantageously maintained at a temperature less than 200° C. during the step of exposing to electromagnetic radiation.

The step of exposing to electromagnetic radiation can be continuous or sequential.

In an embodiment, the step of exposing to the electromagnetic radiation comprises a plurality of phases of exposing with a period less than or equal to 0.2 s, separated by phases of cooling, and the stack is maintained at a temperature less than or equal to 320° C. during each one of the phases of exposing.

Advantageously, the substrate has a concentration in doping impurities of the acceptor type less than $10^{13}$ cm⁻³ preferably less than $3.10^{12}$ cm⁻³.

When the substrate comprises doping impurities of the donor type and doping impurities of the acceptor type, the concentration in doping impurities of the donor type is preferably greater than 50 times the concentration in doping impurities of the acceptor type.

A second aspect of the invention relates to a method for manufacturing a heterojunction photovoltaic cell. This manufacturing method comprises the following steps:
forming a stack by depositing a passivation layer of hydrogenated amorphous silicon on a face of a substrate of n-doped crystalline silicon;
exposing the stack to electromagnetic radiation during a treatment period less than or equal to 12 s, the electromagnetic radiation having an irradiance greater than or equal to 200 kW/m².

The manufacturing method according to the second aspect of the invention can also have one or more of the characteristics hereinbelow, taken individually or according to any technically permissible combination.

In an embodiment, the manufacturing method further comprises a step of depositing a doped amorphous silicon layer on the passivation layer.

According to a development, the stack is exposed to the electromagnetic radiation during the deposition of the doped amorphous silicon layer.

In an embodiment, the manufacturing method further comprises a step of depositing a transparent conductive oxide layer on the doped amorphous silicon layer.

According to a development, the stack is exposed to the electromagnetic radiation during the step of depositing the transparent conductive oxide layer.

In an embodiment, the manufacturing method further comprises a step of forming at least one electrode on the transparent conductive oxide layer, the step of forming said at least one electrode comprising an operation of depositing by screen printing a metal paste and an operation of hardening of the metal paste.

According to a development, the operation of hardening the metal paste and the step of exposing to the electromagnetic radiation are accomplished simultaneously.

BRIEF DESCRIPTION OF THE FIGURES

Other characteristics and advantages of the invention shall appear clearly in the description which is given of them hereinbelow, for the purposes of information and in a non-limiting manner, in reference to the following figures.

For increased clarity, identical or similar elements are marked with identical reference signs on all the figures.

DETAILED DESCRIPTION

Figure 2:
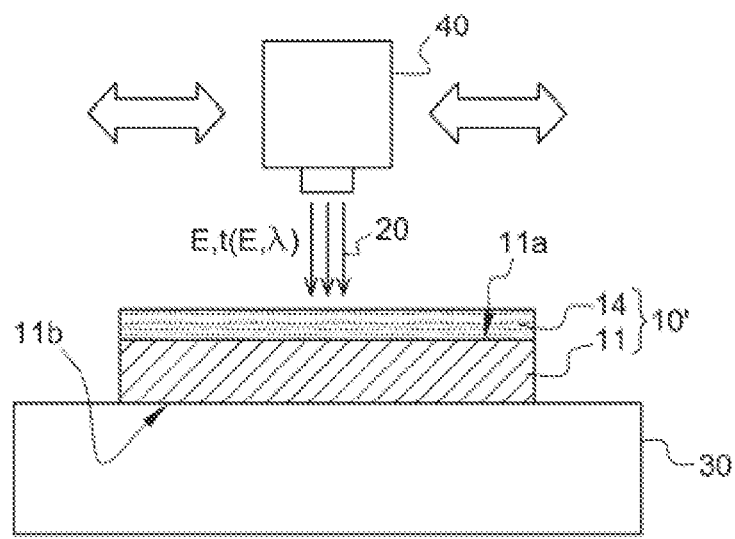
FIG. 2 schematically shows a method for treating a stack according to the first aspect of the invention

FIG. 2 schematically shows a method for treating a stack 10' obtained during the manufacture of a heterojunction photovoltaic cell. The stack 10' comprises a substrate 11 of n-doped crystalline silicon (c-Si) and a first passivation layer 14 disposed on a first face 11a of the substrate 11. The stack 10' can be a heterojunction photovoltaic cell precursor, i.e. an intermediate product obtained during the manufacture of a heterojunction photovoltaic cell, or a finalised heterojunction photovoltaic cell (i.e. ready to be interconnected with other heterojunction photovoltaic cells).

Only doping impurities of the donor type (for example phosphorous atoms) were voluntarily introduced into the crystalline silicon of the substrate 11 so as to modify its electrical conductivity. In addition to doping impurities of the donor type, the substrate 11 can contain, unintentionally (and therefore in trace amounts), doping impurities of the acceptor type (such as boron atoms). The concentration in doping impurities of the acceptor type $N_A$ of the substrate 11 is advantageously less than $10^{13}$ cm$^{-3}$, preferably less than $3.10^{12}$ cm$^{-3}$. The concentration in doping impurities of the donor type $N_D$ is preferably greater than 50 times the concentration in doping impurities of the acceptor type $N_A$ (or $N_D/N_A > 50$).

The first passivation layer 14 is of hydrogenated amorphous silicon (a-Si:H). The hydrogenated amorphous silicon of the first passivation layer 14 is preferably intrinsic, i.e. unintentionally doped. The intrinsic hydrogenated amorphous silicon indeed allows for a better chemical passivation of the surfaces of crystalline silicon than the doped hydrogenated amorphous silicon.

In reference to FIG. 2, the treating method comprises a step of exposing the stack 10' to electromagnetic radiation 20 during a treatment period t which is advantageously according to the total irradiance E of the electromagnetic radiation 20 and of the wavelength λ (or of the wavelengths) of the electromagnetic radiation 20. The irradiance E, also called luminous flux power density, represents the power of the electromagnetic radiation received by one unit of area, this unit of area being oriented perpendicularly to the direction of the electromagnetic radiation.

The exposing step, also called illuminating step, can be accomplished by disposing the stack 10' on a support 30 and under a source of radiation 40. The electromagnetic radiation 20 (emitted by the source 40) is preferably directed perpendicularly to the surface of the stack 10'.

Exposing the stack 10' to electromagnetic radiation 20 has for effect to reduce the number of interface states between the crystalline substrate 11 and the first passivation layer 14. In other words, the number of neutralised interface defects increases and the quality of the passivation increases. This results in an increase in the open-circuit voltage $V_{OC}$ and in the form factor (FF) of the photovoltaic cell and consequently an increase in its conversion efficiency.

In order to improve the conversion efficiency of the cell, it is not useful to expose more than one face of the stack 10' to electromagnetic radiation 20. On the other hand, this face of the stack 10' can be illuminated entirely. Preferably, all the regions of the exposed face of the stack 10' receive the electromagnetic radiation 20 during the same treatment period t.

The two faces of the stack 10' can also be exposed simultaneously (by providing two sources of radiation 40), for example in order to divide the treatment time in half, or successively.

The support 30 is for example a substrate holder. It can be coupled to a cooling system (not shown), so as to maintain the temperature of the stack 10' below 200° C. Indeed, after several seconds spent beyond this threshold temperature, the amorphous silicon of the first passivation layer 14 degrades irremediably, resulting in a decrease in the performance of the photovoltaic cell. The support 30 is for example cooled by circulating a heat transfer fluid or using Peltier elements.

The source of radiation 40 can be a laser system comprising for example one or more laser arrays, a set of light-emitting diodes or any other device capable of emitting electromagnetic radiation of an irradiance greater than 200 kW/m$^2$.

A system for displacing the support 30 or the source 40 can be provided so as to move the support 30 and the source 40 by a relative translation movement. A translation system makes it possible to illuminate an entire face of the stack 10' in the case of a source 40 that has an illumination surface less than the surface area of the face of the stack 10' (case with a laser system in particular). It also makes it possible to illuminate several stacks 10' successively, these stacks being for example disposed on the same support.

The electromagnetic radiation 20 can be monochromatic, i.e. have only one wavelength, or polychromatic, i.e. comprise several components (monochromatic) with different wavelengths. More precisely, the electromagnetic radiation 20 has at least one wavelength comprised between 400 nm and 1100 nm (in this range, the radiation if absorbed as least partially in the n-type crystalline substrate), preferably between 800 nm and 1000 nm.

The wavelength range [800 nm-1000 nm] constitutes an excellent compromise between the flux of photons arriving on the stack 10' and the probability that these photons are absorbed by the substrate. Indeed, the higher the wavelength is, the less energetic the photons are and the more substantial the flow of photons received by the stack is at a given irradiance. However, the probability of absorption of the photons decreases substantially when the wavelength becomes higher than 1000 nm. Another advantage of high wavelengths (800-1000 nm) comes from the fact that the most energetic photons (<800 nm) transfer a portion of the energy in the form of heat in the stack, via the emission of phonons. However the increase in temperature that results is not desirable due to the risk of degradation of the amorphous silicon.

The stack 10' advantageously comprises a second passivation layer (not shown in FIG. 2) disposed on a second face 11b of the substrate 11, opposite the first face 11a. The second passivation layer can be of intrinsic hydrogenated amorphous silicon, silicon nitride, aluminium oxide, titanium oxide or silicon oxide. Like the first passivation layer 14, the second passivation layer contributes to reducing the number of recombinations of electron-hole pairs on the surface of the substrate 11, thus increasing the level of injection in the stack 10' during the step of illuminating (and of the later operation of the photovoltaic cell).

The first face 11a of the substrate 11 (covered with the first passivation layer 14) can be turned towards the source of radiation 40, as shown in FIG. 2. Alternatively, the second face 11b of the substrate 11 can be turned towards the source of radiation 40.

The stack 10' can also comprise a p-doped amorphous silicon layer (not shown) intended to form the emitter of the photovoltaic cell and disposed on the first passivation layer 14 or the second passivation layer.

Figure 1:
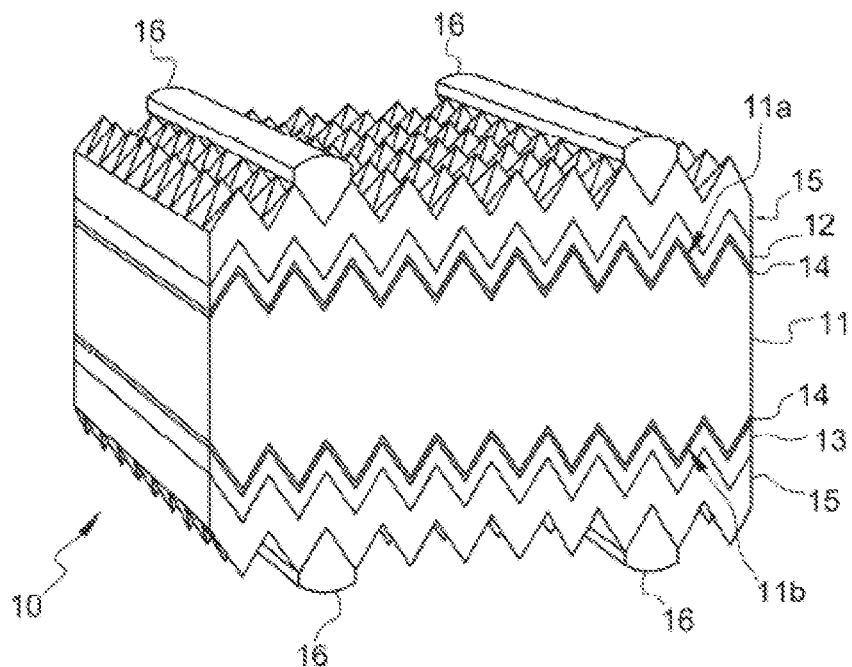
FIG. 1 is a schematical view in perspective of an example of a heterojunction photovoltaic cell.

In an embodiment of the treating method, the stack 10' is of the type shown in FIG. 1 and comprises:
- a substrate 11 of n-doped crystalline silicon;
- a first passivation layer 14 of hydrogenated amorphous silicon (and preferably intrinsic) disposed on the first face 11a of the substrate 11;

a first amorphous silicon layer 12, disposed on the first passivation layer 14 and doped with a first type of conductivity;

a first transparent conductive oxide layer 15 disposed on the first doped amorphous silicon layer 12;

a second passivation layer 14 of hydrogenated amorphous silicon (and preferably intrinsic) disposed on the second face 11b of the substrate 11;

a second amorphous silicon layer 13, disposed on the second passivation layer 14 and doped with a second conductivity type opposite the first conductivity type; and a second transparent conductive oxide layer 15 disposed on the second doped amorphous silicon layer 13.

Such a stack or precursor of heterojunction photovoltaic cells is qualified as asymmetrical due to the two amorphous silicon layers 12-13 doped with opposite conductivity types and disposed on either side of the substrate 11. The amorphous silicon of the first doped layer 12 and/or of the second doped layer 13 is preferably hydrogenated.

When a stack of the type of FIG. 1 is exposed to electromagnetic radiation 20, a decrease in the series resistance of the photovoltaic cell is furthermore observed.

Figure 3:
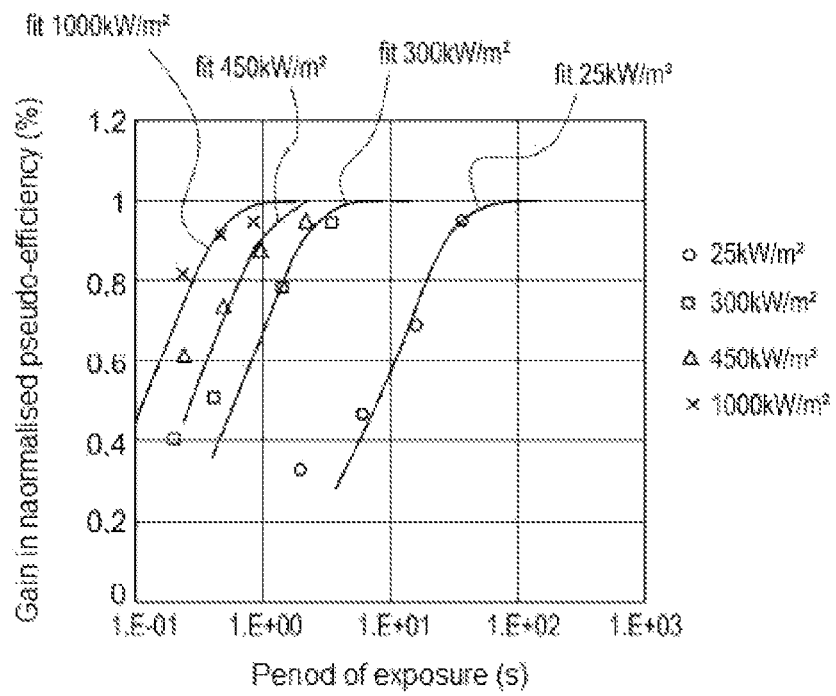
FIG. 3 shows the improvement in the pseudo-efficiency of a silicon heterojunction cell the stack of which was exposed to electromagnetic radiation, for several irradiance values of the radiation.

FIG. 3 is a graph showing the gain in conversion pseudo-efficiency of an n-type heterojunction cell the stack of which was exposed to electromagnetic radiation, according to the period of exposure and for several irradiance values of the radiation. The conversion pseudo-efficiency corresponds to an upper limit of the conversion efficiency, it does not take account of the series resistances in the photovoltaic cell. The variations of the pseudo-efficiency are assumed to be identical to the variations in the efficiency itself. In FIG. 3, the gain in pseudo-efficiency is normalised at its maximum value: a value equal to 1 therefore corresponds to a maximum gain in pseudo-efficiency. The electromagnetic radiation is here monochromatic and has a wavelength of 980 nm.

FIG. 3 shows that the kinetics of the gain in pseudo-efficiency increases with the irradiance of the radiation. A gain of about 95% of its maximum value is for example obtained after only 3 seconds of exposure to a radiation of irradiance equal to 300 kW/m², compared to 40 seconds for a radiation of irradiance equal to 25 kW/m².

In FIG. 3, the experimental values in the normalised gain combined with each irradiance value (25, 300, 400 and 1000 kW/m²) were adjusted via a curve ("fit"). Each curve can be described by an expression of the form:

$$\text{Normalised gain}(t_e) = 1 - e^{-t_e/\tau} \qquad \text{[Math 1]}$$

where $t_e$ is the exposure period and $\tau$ is a time constant.

Hereinbelow, "reference treatment period $t_{ref}$" refers to the exposure time that makes it possible to obtain 95% of the maximum gain in pseudo-efficiency.

$$\text{Normalised gain}(t_{ref}) = 0.95 = 1 - e^{-t_{ref}/\tau} \qquad \text{[Math 2]}$$

A relationship between the irradiance E of the electromagnetic radiation 20 and the reference treatment period $t_{ref}$ can be established by extracting from the graph of FIG. 3 the values of the exposure period that correspond to a normalised gain equal to 0.95.

In the case of electromagnetic radiation with a wavelength equal to 980 nm, the reference treatment period $t_{ref}$ (in seconds) is preferably given by the following expression:

$$t_{ref} = \frac{1000}{E} \qquad \text{[Math 3]}$$

where E is the irradiance of the electromagnetic radiation (i.e. the light power surface density) in kW/m².

In the more general case of monochromatic electromagnetic radiation with a wavelength equal to λ comprised between 400 nm and 1100 nm, the reference treatment period $t_{ref}$ (in seconds) is preferably given by the following expression:

$$t_{ref} = \frac{1000}{E} \times \frac{980}{\lambda} \qquad \text{[Math 4]}$$

where E is the irradiance of the electromagnetic radiation in kW/m².

Thus, the reference treatment period $t_{ref}$ is inversely proportional to the irradiance E of the electromagnetic radiation 20.

Finally, in the case of polychromatic electromagnetic radiation 20 comprising several (monochromatic) components of a wavelength comprised between 400 nm and 1100 nm, the reference treatment period $t_{ref}$ is given by the following relationship:

$$t_{ref} = \frac{1}{\sum_{i=1}^{n} \frac{E_i}{1000} \times \frac{\lambda_i}{980}} \qquad \text{[Math 5]}$$

where i is an index that varies between 1 and the number n of components (n being a natural integer greater than or equal to 2), $\lambda_i$ the wavelength of the component of index i and $E_i$ is the irradiance of the component of index i. The total irradiance E defined hereinabove is equal to the algebraic sum of the irradiances $E_i$ of the different components.

Figure 4:
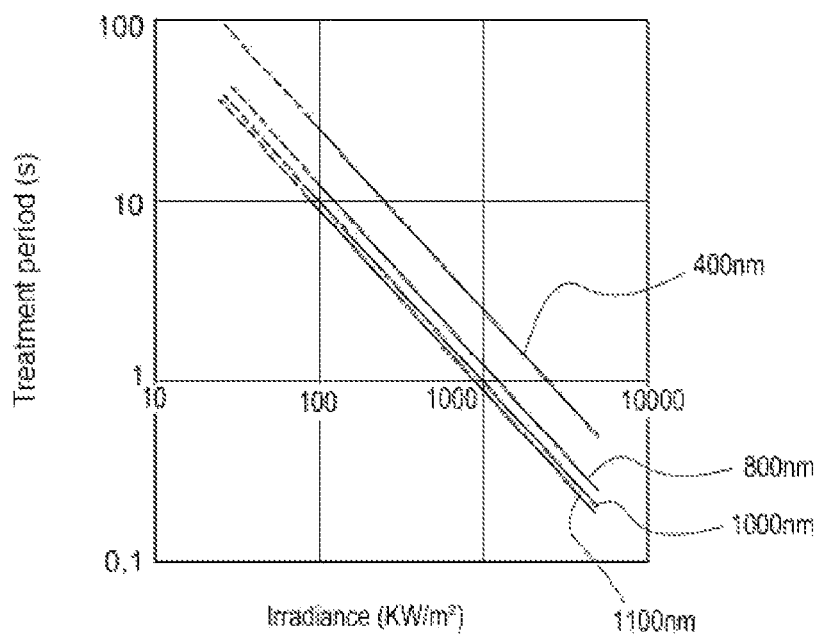
FIG. 4 shows different characteristic curves of a period of exposure to electromagnetic radiation according to the irradiance of the radiation, these different curves corresponding to monochromatic radiation of different wavelengths.

FIG. 4 is an abacus comprising several characteristic curves of the reference treatment period $t_{ref}$ (required to obtain 95% of the maximum gain in pseudo-efficiency) with monochromatic electromagnetic radiation, according to the irradiance E of the radiation. The different curves correspond to different wavelengths: 400 nm, 800 nm, 1000 nm and 1100 nm.

For the same irradiance E, the reference treatment period $t_{ref}$ decreases when the wavelength increases. Thus, by examining the characteristic curve corresponding to a wavelength of 400 nm, a maximum treatment period can be deduced that makes it possible to optimise the pseudo-efficiency.

For an irradiance E of the electromagnetic radiation 20 greater than or equal to 200 kW/m², this maximum treatment period is about 12 seconds ($t_{ref}$=12 s at 400 nm, $t_{ref}$=6 s at 800 nm, $t_{ref}$=4.9 s at 1000 nm and $t_{ref}$=4.45 s at 1100 nm).

The period during which the stack 10' is subjected to electromagnetic radiation 20, here called the treatment period t, is less than or equal to 12 s, so as to be compatible with the throughput of current heterojunction photovoltaic cells production lines. The treating method described in relation with FIG. 2 can therefore be integrated into the method for manufacturing heterojunction photovoltaic cells without limiting the throughput thereof.

For an irradiance E of the electromagnetic radiation 20 greater than or equal to 300 kW/m², the treatment period t is advantageously less than or equal to 8 seconds ($t_{ref}$=8 s at 400 nm according to the chart of FIG. 4, $t_{ref}$=4 s at 800 nm, $t_{ref}$=3.3 s at 1000 nm and $t_{ref}$=3 s at 1100 nm).

The step of exposing to electromagnetic radiation can be continuous, i.e. accomplished at a single time, if the treatment period t and the irradiance E of the electromagnetic radiation 20 are such that the temperature of the stack 10' does not exceed 200° C. (with possibly the assistance of a cooling system). If the treatment period t and the irradiance E of the radiation are such that the temperature of the stack exceeds 200° C., in the absence of a cooling system or in the case of an insufficient cooling system, the step of exposing can be carried out in sequences, i.e. broken down into several phases of exposing which are separated by phases of cooling (by natural or forced convection). The treatment period t is then reached in n phases of exposing of x seconds (n being a natural positive integer and x a positive real number).

In a preferred embodiment of the treating method, the irradiance E of the electromagnetic radiation 20 is greater than or equal to 1000 kW/m² and the treatment period t is advantageously less than or equal to 2.5 seconds ($t_{ref}$=2.5 s at 400 nm according to the chart of FIG. 4, $t_{ref}$=1.2 s at 800 nm, $t_{ref}$=0.98 s at 1000 nm and $t_{ref}$=0.9 s at 1100 nm).

A period of exposing less than or equal to 2.5 s makes it possible to ease the constraints on the implementation of the method, in particular on the thermal management of the stack 10'. Amorphous silicon is indeed capable of supporting high temperatures, much higher than 200° C., for very short periods. This can make it possible to carry out the step of exposing in a single time, reduce the number of phases in the case of a step of sequential exposing or use a less effective cooling system (and therefore less expensive).

For example, the amorphous silicon of the stack 10' can support a temperature of about 320° C. for about 0.2 seconds (after which it undergoes irreversible damage). It can therefore be considered to carry out the step of exposing sequentially, with phases of a period equal to 0.2 s, if needed by maintaining the temperature of the stack below 320° C.

A treatment period t greater than the reference treatment period $t_{ref}$ for a given wavelength and irradiance van be beneficial for the cell, because it makes it possible for a gain in pseudo-efficiency to exceed 95% of the maximum gain.

The minimum treatment period $t_{min}$ is defined as being the exposure period for which 50% of the maximum gain is obtained:

$$\text{Normalised gain}(t_{min})=0.5=1-e^{-t_{min}/\tau} \quad \text{[Math 6]}$$

The equations [Math 2] and [Math 6] make it possible to reach the following relationship between the reference treatment period $t_{ref}$ and the minimum treatment period $t_{min}$:

$$\frac{t_{min}}{t_{ref}} = \frac{\ln(0.5)}{\ln(0.05)} \text{ or:} \quad \text{[Math 7]}$$

$$t_{min} = 0.23 \times t_{ref} \quad \text{[Math 8]}$$

A treatment period t greater than or equal to the minimum treatment period $t_{min}$ (or 23% of the reference treatment period $t_{ref}$, given by the expressions [Math 4] or [Math 5] according to the type of electromagnetic radiation) makes it possible to obtain a gain in pseudo-efficiency that is greater than or equal to 50% of its maximum value. A treatment period t greater than or equal to the minimum treatment period $t_{min}$ and less than or equal to the reference treatment period $t_{ref}$ makes it possible to obtain a gain in pseudo-efficiency comprised between 50% and 95% of its maximum value.

The treating method described hereinabove can be accomplished at different stages of the manufacture of n-type heterojunction photovoltaic cells. An n-type heterojunction photovoltaic cell designates a heterojunction photovoltaic cell made from a substrate of n-doped crystalline silicon. This photovoltaic cell can be a monofacial or bifacial cell. In a monofacial cell, only the front face captures the solar radiation. In a bifacial cell, the front and rear faces each capture a portion of the solar radiation. The front face captures the incident radiation (i.e. direct) while the rear face captures the diffused or reflected radiation. The front face of a bifacial cell is the one that makes it possible to obtain the maximum electrical current when it is turned towards the incident radiation. The emitter of the n-type heterojunction photovoltaic cell, i.e. the p-doped amorphous silicon layer, can be located on the front face or on the rear face of the cell.

Generally, the method for manufacturing n-type heterojunction photovoltaic cells comprises (in reference to FIG. 1):

the deposition of a first passivation layer 14 of hydrogenated amorphous silicon (preferably intrinsic) on a first face of the substrate 11;

the deposition of a first doped amorphous silicon layer (and preferably hydrogenated) 12 on the first passivation layer 14;

the deposition of a first transparent conductive oxide layer 15 on the first doped amorphous silicon layer 12; and the formation of at least one collecting electrode 16 on the first transparent conductive oxide layer 15;

and, when the first amorphous silicon layer 12 is n-doped:

the deposition of a second passivation layer 14 on an opposite second face of the substrate 11;

the deposition of a second p-doped amorphous silicon layer 13 (and preferably hydrogenated) on the second passivation layer 14.

The manufacture of a bifacial photovoltaic cell, such as the photovoltaic cell 10 shown in FIG. 1, further comprises the deposition of a second transparent conductive oxide layer 15 on the second doped amorphous silicon layer 13 and the formation of at least one collecting electrode 16 on the second transparent conductive oxide layer 15. One among the first and second amorphous silicon layers 12-13 is p doped and the other of these layers 12-13 is n doped.

In order to avoid complicating the method for manufacturing the photovoltaic cell by creating an additional step, the treating method is advantageously integrated into an already existing step. For example, the stack comprising the substrate 11 and the first passivation layer 14 can be illuminated during the deposition of the first doped amorphous silicon layer 12 or the deposition of the second doped amorphous silicon layer 13. Preferably, the stack is illuminated during the deposition of the p-doped amorphous silicon layer (with the improvement in the passivation being more sensitive than during the deposition of the n-doped amorphous silicon layer).

The stack can also be illuminated during the deposition of the first transparent conductive oxide layer 15 on the first doped amorphous silicon layer 12 or, in the case of a bifacial cell only, during the deposition of the second transparent conductive oxide layer 15 on the second doped amorphous silicon layer 13. The interface between each transparent conductive oxide layer and the underlying doped amorphous silicon layer can thus be improved.

The stack can also be illuminated during the formation of the collecting electrodes 16 on the first transparent conductive oxide layer 15 or, in the case of a bifacial cell only, on the second transparent conductive oxide layer 15. The formation of the collecting electrodes 16 generally comprises two operations:

a first operation consisting of depositing by screen printing a metal paste on the (first or second) transparent conductive oxide layer 15: and a second operation consisting of hardening the metal paste, for example by means of a thermal treatment, so as to reduce the resistivity of the collecting electrodes (metallic).

This second operation of hardening the metal paste and the step of illuminating the stack are advantageously accomplished simultaneously. The heat produced by the illumination thus contributes to the hardening of the metal paste.

The treating method can also be applied to a heterojunction photovoltaic cell in its final state (after the formation of the collecting electrodes 16 on the transparent conductive oxide layer or layers 15).

A bifacial photovoltaic cell can be illuminated indifferently by the front face or by the rear face. Indeed, neither the transparent conductive oxide layer 15, nor the collecting electrodes 16 (present on the front face and on the rear face of the cell) form an obstacle to electromagnetic radiation 20.

The illumination of a monofacial photovoltaic cell is carried out via the front face, the cell comprising on the rear face an opaque metallisation that occupies the entire surface or a network of electrodes that is sufficiently dense to block most of the electromagnetic radiation.

In the context of manufacturing so-called "tandem" cells comprising a first perovskite-based cell (referred to as the "upper" cell) disposed on a silicon heterojunction cell (referred to as "lower" cell), it can also be advantageous to treat the heterojunction cell before the deposition of the perovskite cell, both to improve the passivation layers of the heterojunction cell and to improve the future interface between the two cells. In this case, the treating method can intervene at the end of the manufacture of the heterojunction cell or during one of the steps for manufacturing the heterojunction cell.

Alternatively, the treating method can be applied after the deposition of the perovskite cell on the silicon heterojunction cell, with the condition of maintaining a treatment temperature less than 200° C., preferably less than or equal to 150° C.

Finally, the treating method can also be applied to a heterojunction photovoltaic cell within a module.

Another aspect of the invention therefore relates to a method for treating a photovoltaic module comprising at least two silicon heterojunction photovoltaic cells (SHJ) electrically connected together. Each SHJ cell comprises a substrate of n-doped crystalline silicon and a passivation layer of hydrogenated amorphous silicon disposed on a face of the substrate. The SHJ cells of the photovoltaic module are for example of the type of FIG. 1. The method of treating comprises a step of exposing SHJ cells to electromagnetic radiation during a treatment period less than or equal to 12 s, the electromagnetic radiation having an irradiance greater than or equal to 200 kW/m². The SHJ cells are advantageously maintained at a temperature lower than 200° C. during the step of exposing to electromagnetic radiation.

An example embodiment of the treating method shall now be described. Six silicon heterojunction cells 10 identical to the one of FIG. 1 were exposed for 3 seconds to electromagnetic radiation of an irradiance equal to 300 kW/m² and with a wavelength equal to 980 nm. The exposure of each cell is done by carrying out several passes under a laser head (the sum of the passage times being equal to 3 seconds).

Figure 5:
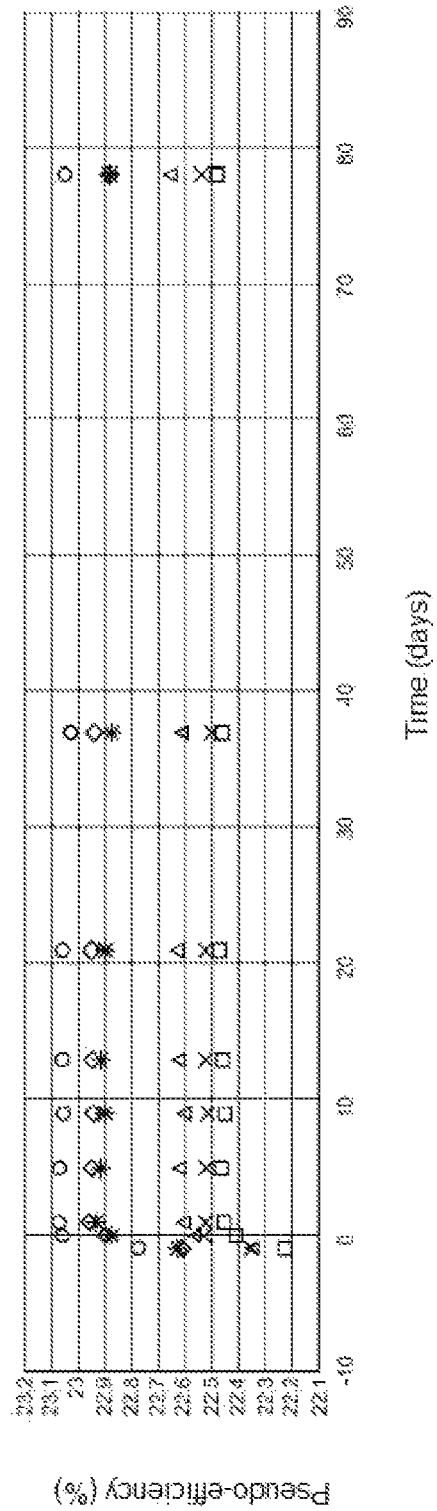
FIG. 5 shows the change in the pseudo-efficiency of six silicon heterojunction photovoltaic cells, after an exposure of 3 seconds to electromagnetic radiation having an irradiance of 300 kW/m².

FIG. 5, which shows the change in the pseudo-efficiency of six photovoltaic cells overtime, shows a gain in pseudo-efficiency of about 0.3% absolute (visible at t<0) and that this gain is stable over a very long period, here nearly 3 months during which the cells were stored in the dark.

The invention claimed is:

1. A method for treating a stack comprising a substrate of n-doped crystalline silicon and a passivation layer of hydrogenated amorphous silicon disposed on a face of the substrate, said method comprising exposing the stack to electromagnetic radiation during a treatment period (t) less than or equal to 8 s, the electromagnetic radiation having an irradiance (E) greater than or equal to 300 kW/m².

2. The method according to claim 1, wherein the irradiance (E) of the electromagnetic radiation is greater than or equal to 1000 kW/m² and wherein the treatment period (t) is less than or equal to 2.5 s.

3. The method according to claim 1, wherein the treatment period (t) is inversely proportional to the irradiance (E).

4. The method according to claim 1, wherein the electromagnetic radiation is monochromatic and has a wavelength (λ) comprised between 400 nm and 1100 nm.

5. The method according to claim 4, wherein the treatment period (t) satisfies the following relationship:

$$t \geq 0.23 \times \frac{1000}{E} \times \frac{980}{\lambda}$$

where λ is the wavelength of the electromagnetic radiation and E is the irradiance of the electromagnetic radiation.

6. The method according to claim 5, wherein the treatment period (t) furthermore satisfies the following relationship:

$$t \leq \frac{1000}{E} \times \frac{980}{\lambda}.$$

7. The method according to claim 1, wherein the electromagnetic radiation comprises several components with a wavelength comprised between 400 nm and 1100 nm.

8. The method according to claim 7, wherein the treatment period (t) satisfies the following relationship:

$$t \geq 0.23 \times \frac{1}{\sum_{i=1}^{n} \frac{E_i}{1000} \times \frac{\lambda_1}{980}}$$

where i is an index that varies between 1 and the number n of components of the electromagnetic radiation, $\lambda_i$ is the wavelength of the component of index i and $E_i$ is the irradiance of the component of index i.

9. The method according to claim 8, wherein the treatment period (t) furthermore satisfies the following relationship:

$$t \leq \frac{1}{\sum_{i=1}^{n} \frac{E_i}{1000} \times \frac{\lambda_1}{980}}.$$

10. The method according to claim 1, wherein the exposing of the stack to the electromagnetic radiation is continuous or sequential.

11. The method according to claim 1, wherein the exposing of the stack to the electromagnetic radiation comprises a plurality of phases of exposing of the stack with a period less than or equal to 0.2 s, separated by phases of cooling, and wherein the stack is maintained at a temperature less than or equal to 320° C. during each one of the phases of exposure.

12. The method according to claim 1, wherein the substrate has a concentration in doping impurities of the acceptor type less than $10^{13}$ cm$^{-3}$.

13. A method for treating a stack comprising a substrate of n-doped crystalline silicon and a passivation layer of hydrogenated amorphous silicon disposed on a face of the substrate, said method comprising exposing the stack to electromagnetic radiation during a treatment period (t) less than or equal to 12 s, the electromagnetic radiation having an irradiance (E) greater than or equal to 200 kW/m$^2$, wherein the stack is maintained at a temperature less than 200° C. during the exposing of the stack to electromagnetic radiation.

14. A method for manufacturing a heterojunction photovoltaic cell, comprising:
  forming a stack by depositing a passivation layer of hydrogenated amorphous silicon on a face a of a substrate of n-doped crystalline silicon;
  exposing the stack to electromagnetic radiation during a treatment period (t) less than or equal to 8 s, the electromagnetic radiation having an irradiance (E) greater than or equal to 300 kW/m$^2$.

15. The method according to claim 14, further comprising depositing a doped amorphous silicon layer on the passivation layer.

16. The method according to claim 15, wherein the stack is exposed to the electromagnetic radiation during the deposition of the doped amorphous silicon layer.

17. The method according to claim 15, further comprising depositing a transparent conductive oxide layer on the doped amorphous silicon layer.

18. The method according to claim 17, wherein the stack is exposed to electromagnetic radiation during the depositing of the transparent conductive oxide layer.

19. The method according to claim 17, further comprising forming at least one electrode on the transparent conductive oxide layer, the forming of said at least one electrode comprising an operation of depositing by screen printing a metal paste and an operation of hardening the metal paste, and wherein the operation of hardening the metal paste and the exposing to the electromagnetic radiation are accomplished simultaneously.

* * * * *